United States Patent [19]

Suptitz et al.

[11] Patent Number: 5,751,284
[45] Date of Patent: May 12, 1998

[54] CURRENT SIGNAL CORRECTION PROCESS AND DEVICE

[75] Inventors: Eric Suptitz, Grenoble; Pierre Blanchard, Voreppe, both of France; James Collier, Cambridgeshire, United Kingdom

[73] Assignee: Schneider Electric, S.A., France

[21] Appl. No.: 416,361

[22] Filed: Apr. 4, 1995

[30] Foreign Application Priority Data

Apr. 21, 1994 [FR] France ................................ 94 04924

[51] Int. Cl.$^6$ ........................................ G01R 1/02
[52] U.S. Cl. .............................. 324/127; 324/130; 361/93
[58] Field of Search ................................ 324/123, 127, 324/130, 132; 361/87, 93

[56] References Cited

U.S. PATENT DOCUMENTS 3,509,460  4/1970  Mizrahi .................................... 324/123
4,914,385  4/1990  Arinobu .................................... 324/127

FOREIGN PATENT DOCUMENTS 0570304  11/1993  European Pat. Off. .

OTHER PUBLICATIONS

Soviet Patents Abstracts, Section El, Week 9001, 14 Feb. 1990.
Soviet Patents Abstracts, Section El, Week 8848, 18 Jan. 1989.

*Primary Examiner*—Ernest F. Karlsen
*Assistant Examiner*—Anh Phung
*Attorney, Agent, or Firm*—Parkhurst, Wendel & Burr, L.L.P.

[57] ABSTRACT

A signal representative of a rectified current supplied by a current sensor is applied to the input of a correction circuit. The form of the input signal of the correction circuit, deformed with respect to the form of a theoretical signal, is corrected so as to reduce the errors of the rms or mean current values. The output signal of the correction circuit is equal to the input signal if the difference between the output signal and the input signal is lower than a limiting value. In the opposite case, the output signal is equal to a variation signal equal to the limiting value. Application to measuring devices and trip relays.

12 Claims, 4 Drawing Sheets

CURRENT SIGNAL CORRECTION PROCESS AND DEVICE

BACKGROUND OF THE INVENTION

The invention relates to a process and device for correction of a deformed current signal and to an electronic trip device comprising such a device.

In alternating current, the current sensors are generally current transformers comprising a magnetic circuit. In a primary winding the current to be measured flows and in a secondary winding there flows a current representative of the current to be measured. The current sensors are, in a known manner, integrated into electronic trip devices for circuit breakers. In this type of product, signals representative of the current in the secondary winding are used by a processing unit to perform protection according to preset tripping curves. The processing unit calculates the rms value of the current and the square of the current, for use in thermal protection curves.

Electronic trip devices have to operate at much higher current levels than their rated current. But it does happen that for certain circuit breaker ratings, the current transformers do not have a linear response over the whole measuring and protection range of the trip device. These defects are due to saturation of the magnetic circuit of the transformers at a high current level and to a lack of magnetization at a very low current level. The value of the secondary current becomes lower than the theoretical value and the current curve is different. The change of the current curve leads, over a wide operating range, to current responses of the transformers which are more downgraded in rms value or mean value than in peak value.

Certain known solutions enable this type of defect to be partially corrected. For example U.S. Pat. No. 4,870,532 proposes a device which makes the measuring impedance vary according to the current supplied by the current transformers. This solution is applied to the peak or instantaneous current values and requires electronic power components that are able to pass the current from the current transformers.

SUMMARY OF THE INVENTION

The object of the invention is to achieve a correction process and device enabling current signals deformed by sensors to be corrected, and the application of this process in an electronic trip device.

According to the invention, the process comprises successive correction cycles, each cycle comprising:

storing of an output quantity in memory, measurement of an input quantity representative of the deformed current signal, calculation of the difference between the output quantity stored in memory and the input quantity measured, determination of a new value of the output quantity having a variation with a decrease lower than or equal to a preset limiting value.

In a preferred embodiment, determination of the new output value comprises:

comparison of said difference and the preset limiting value, production of the new value of the output quantity equal to the measured input quantity if the difference is smaller than or equal to said limiting value, production of the new value of the output quantity equal to the difference between the output quantity stored in memory and the limiting value if the difference is greater than the limiting value.

According to a development of the invention, each correction cycle corresponds to a sampling cycle of the input quantity.

In a particular embodiment, measurement of the input quantity comprises a raising of the deformed current signal to a power higher than one.

According to a development of the invention, the process comprises determination of the limiting value according to the frequency of the input quantity.

The invention also relates to a correction device for implementing the process and a trip device comprising such a device.

BRIEF DESCRIPTION OF THE DRAWINGS

Other advantages and features will become more clearly apparent from the following description of particular embodiments of the invention, given as non-restrictive examples only and represented in the accompanying drawings in which.

DETAILED DESCRIPTION OF THE PREFERRED EMBODIMENT

Figure 1:
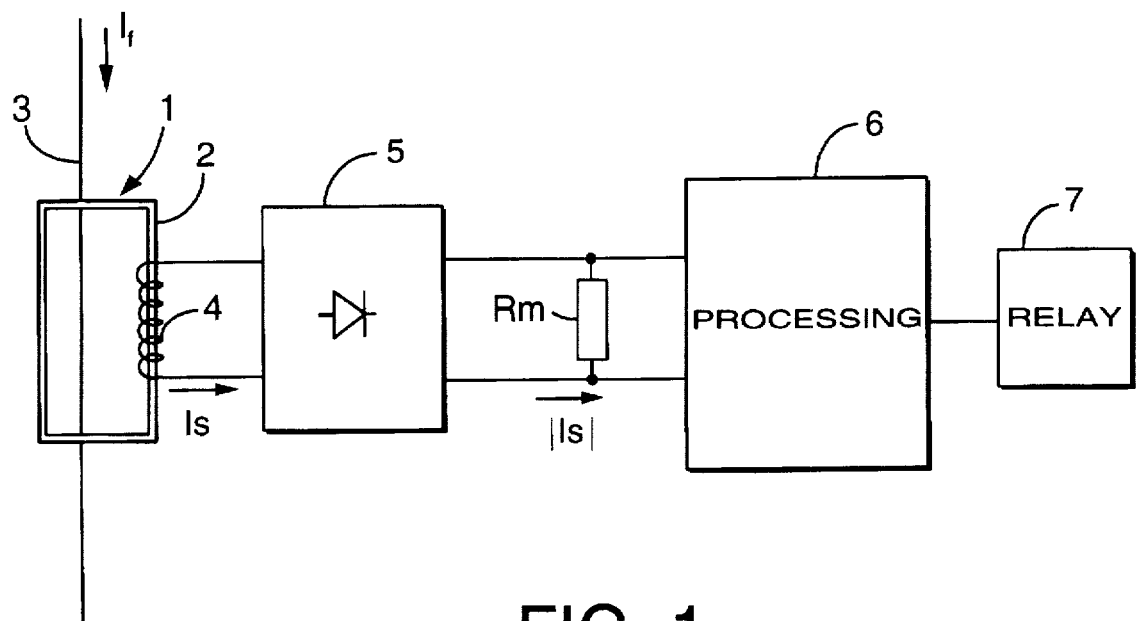
FIG. 1 represents a simplified diagram of a trip device of known type.

FIG. 1 shows the block diagram of an electronic trip device of known type comprising a current transformer 1. The transformer 1 comprises a magnetic circuit 2 through which a main conductor passes conducting the primary current Ip. A secondary winding 4, wound onto the magnetic circuit, supplies a secondary current Is proportional to the primary current Ip. The secondary winding is connected to inputs of a rectifier circuit 5. A measuring resistance Rm, connected to outputs of the rectifier circuit, receives a rectified current. A processing circuit 6 comprises inputs connected to the measuring resistance Rm and an output connected to a tripping relay 7. The processing circuit receives on its inputs a signal representative of the absolute or rectified value of the secondary current Is and supplies a tripping signal depending on the values of said current.

The electronic trip device must operate with a wide measuring range able to range from one tenth to fifteen times the value of the rated current. However, in a general manner, current sensors or transformers generate deformed secondary currents at low current levels and at high current levels. The deformations at low levels are due to the lack of magnetization whereas at high levels the deformations are caused by saturation of the magnetic circuit.

Figure 2:
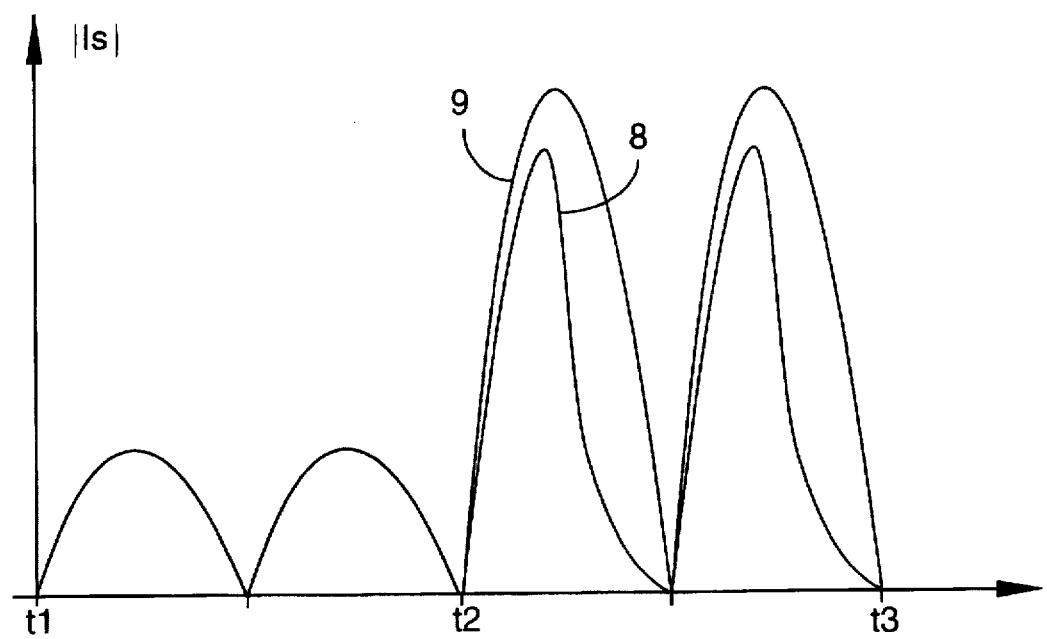
FIG. 2 illustrates theoretical and deformed current signals.

Curves representing rectified secondary currents are illustrated in FIG. 2. Between the times t1 and t2 the rectified secondary current |Is| has a value close to its rated value and does not present any deformation. Between the time t2 and a time t3 the current is very high and deformed. A curve 8 represents a deformed current of lower mean or rms value than the value that a theoretical sine wave current represented by a curve 9. The deformed current of FIG. 8 decreases earlier towards a zero value, with at the beginning at least a faster variation than that of the theoretical current of curve 9.

Figure 3:
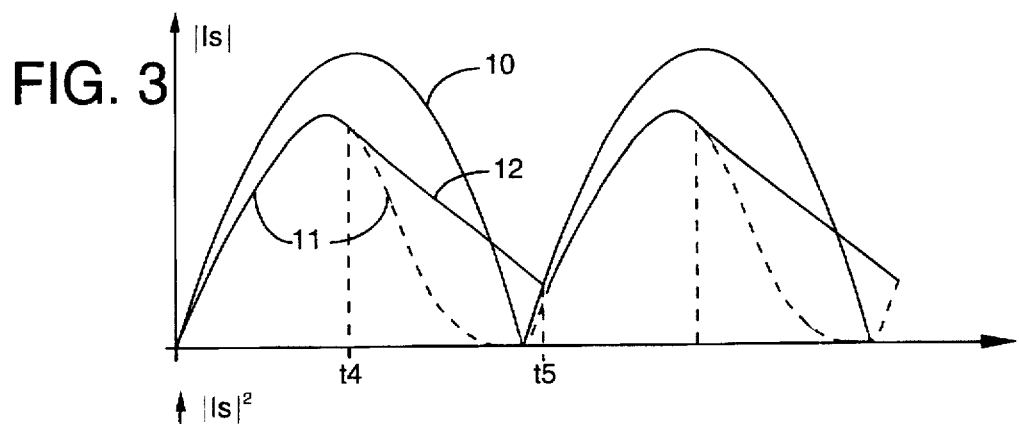
FIGS. 3 and 4 illustrate current signals corrected by a process according to two implementation modes of the invention.

A first embodiment of a correction process is illustrated in FIG. 3. A curve 10 represents a rectified theoretical sine wave signal and a curve 11 a deformed signal representative of the absolute measured current value |Is|. According to this correction process, a correction signal represented by a curve 12 is substituted for the deformed signal 11 when the latter starts to decrease too rapidly towards zero and then so long as it remains lower than said correction signal 12, to within a value lim. In the figure this is the case between the times t4 and t5. In this way the correction process limits the decrease of the signal applied to the processing circuit and compensates for the errors of the mean or rms values of the current.

Figure 4:
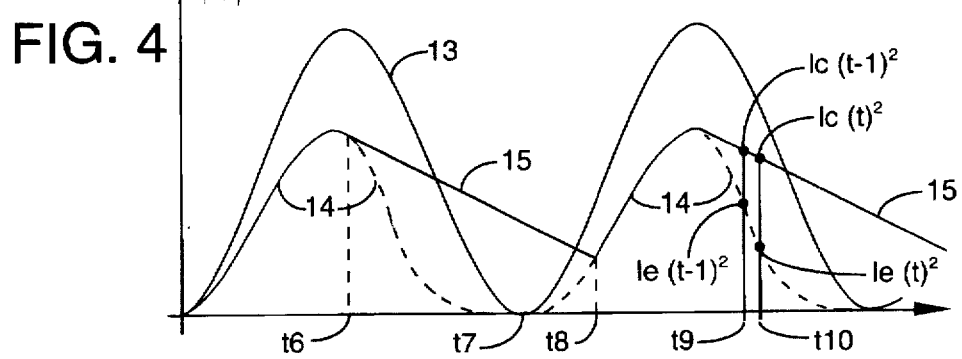

The correction process can be applied to all the quantities representative of the current Is, for example its absolute value a |Is| as in FIG. 3, or its square Is² as in FIG. 4.

A curve 13 represents the theoretical curve of the square of the current when the latter is sinusoidal. A curve represents the deformed curve of the square of the measured current and a curve 15 represents a corrected curve. From the time t6 the signal 15, having a stable decrease controlled by a limiting value lim, is substituted for the signal 14 having a faster decrease than the signal 15. The substitution of the signal 14 by the signal 15 remains active so long as the signal 14 remains lower than the signal 15. At a time t7, corresponding to the beginning of a new period, the signals 13 and 14 start to increase again. Then, at a time t8, the signal 14 becomes greater than the signal 15 and is again used by the processing circuit.

In FIG. 4 samples of signals Ie(t)², Ic(t)², Ic(t−1)² illustrate the correction process of the signal Is². At a time t9 a sample Ie(t−1)² is corrected and replaced by a sample Ic(t−1)² of higher value. The value of the sample Ic(t−1)² is stored to be reused when correction of a following sample Ie(t)² is performed at a time t10. The sample Ie(t)² being much lower than the stored sample Ic(t−1)², the correction process will replace the sample Ie(t)² of curve 14 by a sample Ic(t)² equal to Ic(t−1)²−lim of curve 15.

Figure 5:
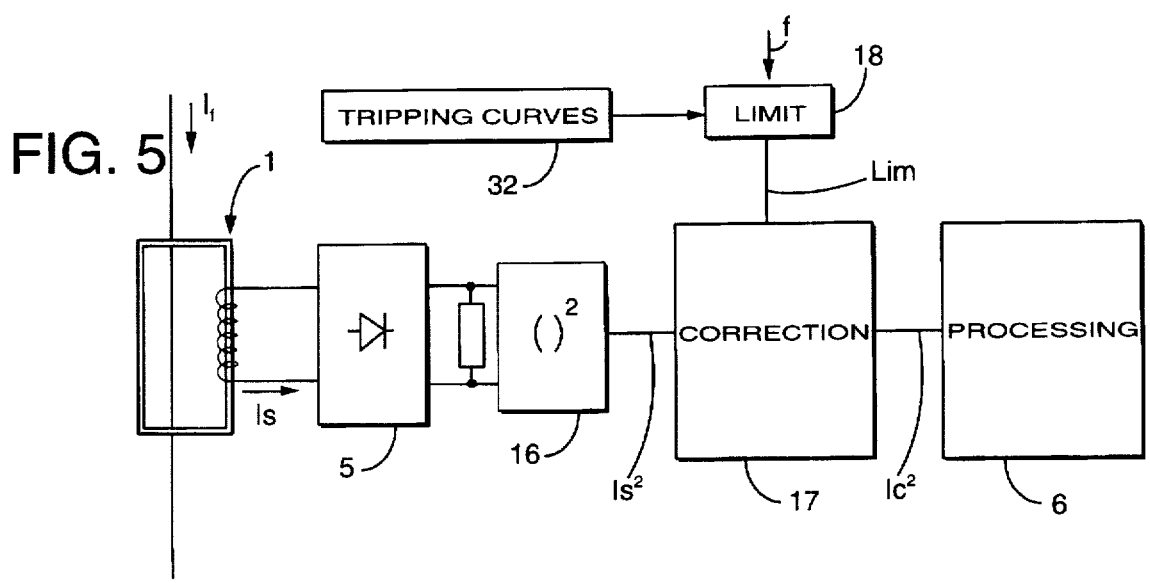
FIG. 5 represents the diagram of a trip device according to a first embodiment.

A diagram of a trip device comprising a device implementing a correction process of the square of the current Is² is represented in FIG. 5. The signal representative of the rectified measured current is applied to the input of a module 16 calculating the square of the measured current. An output of the module 16 supplying a signal Is² is connected to a first input of a correction device 17. The device 17 also receives on a second input a preset limiting value lim stored in a circuit 18. An output of the correction circuit 17, connected to the input of the processing circuit 6, supplies a signal I²c representative of the corrected current according to the correction process.

Figure 6:
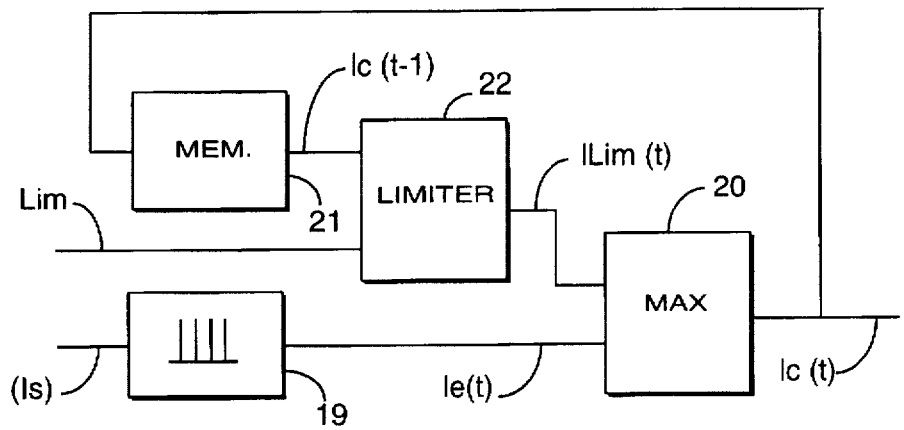
FIGS. 6 and 7 show two embodiments of a correction circuit according to the invention.

A structure of the correction circuit, according to a first embodiment, applied to the absolute value of the measured current, is represented in FIG. 6. The first input receives a signal |Is| representative of the absolute value of the secondary current. The second input receives the limiting value lim and the output supplies the corrected signal Ic. The correction circuit comprises a sampler 19, a maximum detector 20, a storage circuit 21 and a limiter 22. The sampler 19 has an input connected to the first input of the correction circuit and an output connected to a first input of the maximum detector. It supplies on its output a sampled signal Ie representative of the input signal |Is|. The maximum detector 20 has a second input connected to an output of the limiter 22 to receive a signal Ilim (t). An output of the maximum detector, corresponding to the output of the correction circuit, is connected to an input of the storage circuit 21. The output signal of the maximum detector 20 is constituted by a sample corresponding to the highest value chosen between the signals Ie and Ilim applied respectively to the first and second input. An output of the storage circuit 21 is connected to a first input of the limiter 22. The storage circuit keeps the value of the last sample of the output signal Ic(t). It supplies to the limiter a signal Ic(t−1) representative of the previous value of Ic(t). The limiter has a second input corresponding to the second input of the correction circuit to receive the limiting value lim. The limiter supplies to the maximum detector the signal Ilim(t) corresponding to the difference between the previous value of the output signal of the correction circuit Ic(t−1), present on the first input, and the limiting value lim. The value of a sample of Ilim(t) at a time t can be written:

$$Ilim(t)=Ic(t-1)-lim \tag{1}$$

and the value of Ic(t) :

$$Ic(t)=MAX\ (Ie(t)\ ;\ Ilim(t)) \tag{2}$$

Thus, at each sample, a signal Ilim is calculated by decreasing the previous value of the corrected signal Ic(t−1) by a preset value lim. If the value Ilim thus calculated is greater than the measured value Ie, then the correction signal is equal to the calculated value. On the other hand, so long as the measured value Ie is greater than the calculated value; the correction signal Ic is identical to the measured value Ie. The correction circuit of FIG. 6 thus enables the correction process represented in FIG. 3 to be implemented.

Figure 7:
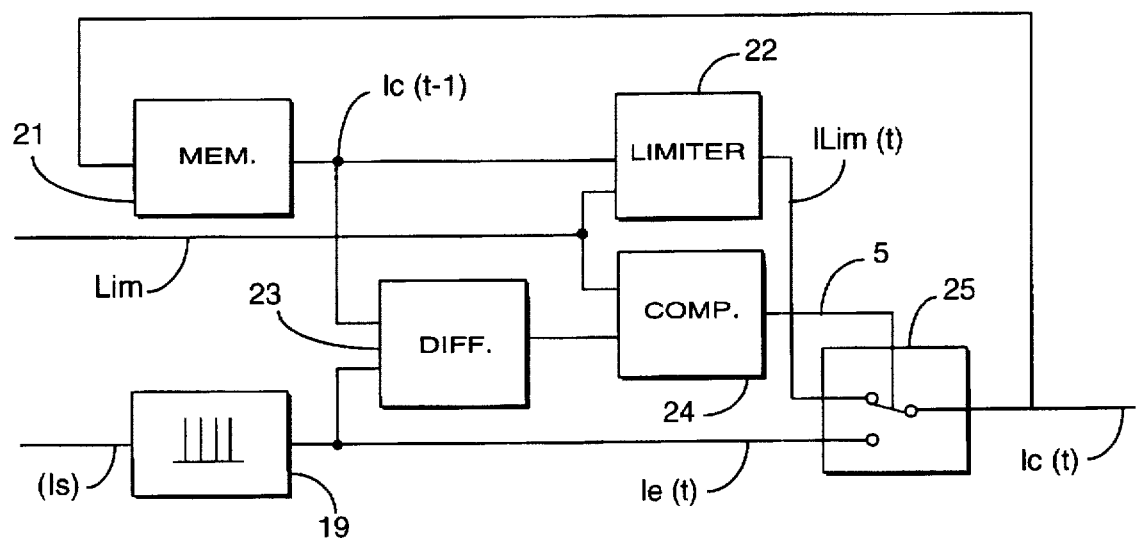

Another, more complex, embodiment of the correction circuit is represented in FIG. 7. The circuit comprises, like that of FIG. 6, a sampler 19, a storage circuit 21 and a limiter 22. The maximum circuit of FIG. 6 is eliminated and the correction circuit comprises a differentiator circuit 23, a comparison circuit 24 and a selection circuit 25. The differentiator circuit 23 comprises two inputs, a first one connected to the output of the sampler 19 and a second to the output of the storage circuit 21. An output of the circuit 23 is connected to a first input of the comparison circuit 24. A second input of the comparison circuit 24 receives the limiting value Lim and an output of the circuit 24 connected to the selection circuit 25 sends it a control signal S. A first input of the selection circuit 25 connected to the output of the sampler 19 receives the signal Ie(t) and a second input connected to the output of the limiter 22 receives the signal I lim (t). An output of the selection circuit 25, corresponding to the output of the correction circuit, supplies the signal Ic(t) representative of the value of the corrected current. The differentiator circuit calculates the difference between a sample Ie(t) coming from the sampler 19 and the previous corrected sample Ic(t−1) stored in the storage circuit 21. The expression of the output signal of the differentiator is Ic(t−1)−Ie(t). The output signal of the circuit 23 is then compared to the limiting value Lim in the comparison circuit 24. If the difference Ic(t−1)−Ie(t) is greater than the limiting value lim, the control signal S sets the selection circuit 25 so as to disconnect its first input from its output and to connect its second input receiving the signal Ilim to its output. The limited current signal Ilim (t) is then substituted for the input signal Ic(t). In a different form, this circuit performs the same function as the circuit of FIG. 6.

Figure 8:
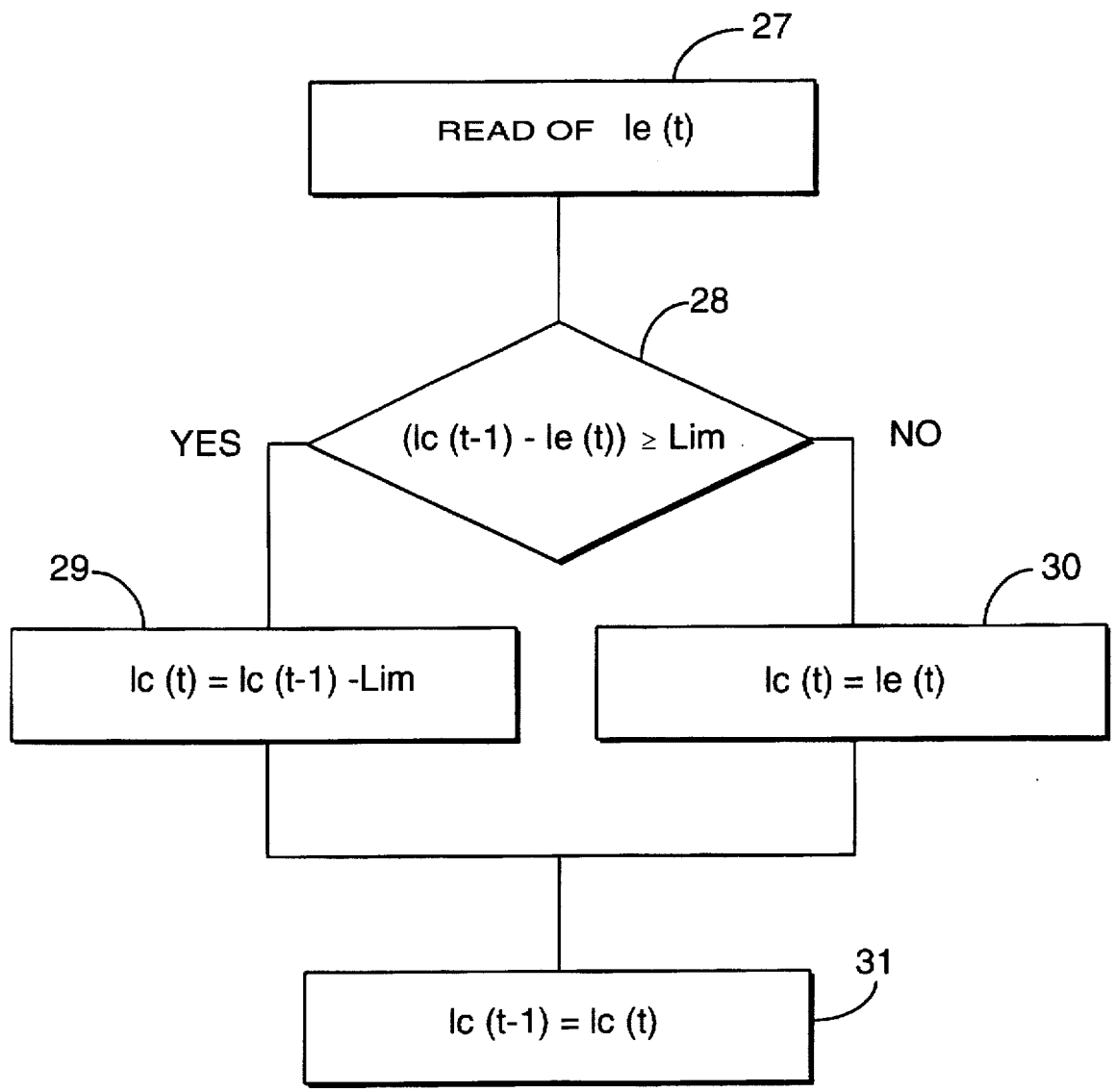
FIG. 8 shows a flow chart of a correction circuit able to be used in the trip device of FIG. 5.

The correction circuit 17 can comprise a microprocessor programmed in such a way as to perform the different stages of the correction process. A corresponding flow chart is represented in FIG. 8. At a stage 27 a sample Ie(t) is read. In a stage 28 the difference between a value Ic(t−1) of a stored previous output sample and the value Ie(t) is compared to the limiting value Lim. If the difference is greater than or equal to lim (output yes) then (stage 29) the output value Ic(t) is equal to the difference between the stored value Ic(t−1) and the limiting value lim, i.e. Ic(t) =Ic(t−1)−lim. In the opposite case (stage 30), the output signal Ic(t) is equal to the input signal Ie(t). Then, in a stage 31, the output signal Ic(t) is stored so as to be used as the previous sample Ic(t−1) in the next sampling cycle. The output signal Ic(t) is then used by the processing circuit of the trip device.

The limiting value is determined according to several parameters of which the main ones are : the-sampling period, the current frequency, the type of tripping curve or the power at which the current is high, the maximum and nominal amplitude of the signal representative of the current and the deformation ratio. For example, for a trip device able to measure a maximum amplitude equal to 11 times the nominal amplitude of a 50 Hz alternating current and having a sampling device operating at a period of 625 μs, the limit value may be about 6% of the maximum amplitude if correction is performed on the square of the current (FIG. 4).

In complex electronic trip devices, the limit value may be determined automatically according to the current frequency or the type of tripping curves.

In this case, the circuit 18, represented in FIG. 5, may comprise two additional inputs. On one of these additional inputs a signal is applied representative of the frequency of the current measured by the current sensors. The other additional input is connected to a selection circuit 32 of the type of tripping curves. In the embodiments represented in the figures, correction is performed either on $|Is|$ or on $Is^2$. It is possible to use the same correction process on $|Is|$, where P is greater than or equal to 1 for example 1.8; 3 or 4. In this case the circuit 32 supplies this value of P to the circuit 18 which takes it into account to determine the limiting value.

The corrections described above apply essentially to currents deformed by saturation of the transformers, but they can be used in the same way for corrections of a signal deformed by lack of magnetization at low current. The means to implement the correction process can be achieved in the form of electronic circuits or be integrated in a program and processed by a microprocessor. In a multipole trip device having a current sensor per pole to be protected, the correction circuits, for raising to a power, or-for processing can be common to all the secondary currents.

The limiting value is preferably fixed and constant although a variable limiting value may, in certain cases, be suitable for correction. For example, the limiting value may be dependent on a value representative of the current according to non-linear functions.

We claim:

1. A process for correcting a deformed current signal comprising successive correction cycles, each cycle comprising the steps of:

storing an output quantity in memory, measuring an input quantity representative of the deformed current signal, calculating the difference between the output quantity stored in memory and the input quantity measured, and determining a new value of the output quantity lower than the output quantity stored in said storing step by less than or equal to a preset limiting value.

2. The process according to claim 1, wherein said step of determining the new output value comprises the steps of:

comparing the difference and the preset limiting value, setting the new value of the output quantity equal to the measured input quantity if the difference is smaller than or equal to the preset limiting value, and setting the new value of the output quantity equal to the difference between the output quantity stored in memory and the preset limiting value if the difference is greater than the preset limiting value.

3. The process according to claim 1, wherein each correction cycle corresponds to a sampling cycle of the input quantity.

4. The process according to claim 1, wherein said measuring step comprises raising the deformed current signal to a power higher than one.

5. The process according to claim 1, further comprising the step of determining the preset limiting value according to the frequency of the input quantity.

6. A correction device, comprising:

an input receiving the input quantity, an output supplying the output quantity, measuring means connected to the input for measuring the input quantity, memory storage means connected to the output, calculation means connected to the memory storage means and to the measuring means to calculate the difference between the stored output quantity and the measured input quantity, and first determination means connected to the memory storage means, to the measuring means, to the calculation means, and to the output to produce a new value of the output quantity lower than the output quantity stored in the storing step by less than or equal to a preset limiting value.

7. The correction device according to claim 6, wherein the first determination means comprises:

comparison means connected to the calculation means to compare said difference and the preset limiting value, and production means connected to the comparison means, to the measuring means, to the memory storage means and to the output to produce the new value of the output quantity equal to the new measured input quantity if the difference is lower than or equal to said preset limit value, or equal to the difference between the stored output quantity and the preset limiting value if the difference is greater than the preset limiting value.

8. An electronic trip device comprising a processing unit, current sensors and correction means connected to the current sensors and to the processing unit, wherein the correction means comprises a correction device according to claim 6.

9. The electronic trip device according to claim 8, further comprising:

second determination means connected to the correction device to determine the limiting value, raising means connected to the input of the correction device to raise the input quantity to a power greater than one, and third determination means connected to the second determination means and to the raising means to determine the value of said power.

10. The process of claim 1, wherein the deformed current signal is provided by AC current sensors.

11. The process of claim 1, wherein the new value is equal to the previous output quantity reduced by the preset limiting value if the difference is greater than the preset limiting value.

12. The process of claim 1, further comprising providing digital circuit memory for said storing step.

* * * * *